United States Patent
Soman et al.

(10) Patent No.: US 7,162,029 B2
(45) Date of Patent: Jan. 9, 2007

(54) GAIN OR INPUT VOLUME CONTROLLER AND METHOD UTILIZING A MODIFIED R2R LADDER NETWORK

(75) Inventors: Manoj Soman, Pune (IN); Krishnan Subramoniam, Austin, TX (US); Hua Hong, Austin, TX (US); Rajendra Datar, Pune (IN); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 317 days.

(21) Appl. No.: 10/447,606

(22) Filed: May 29, 2003

(65) Prior Publication Data

US 2004/0240918 A1    Dec. 2, 2004

(51) Int. Cl.
*H04M 1/00*    (2006.01)
*H04M 9/00*    (2006.01)
(52) U.S. Cl. .................... 379/399.02; 341/144
(58) Field of Classification Search ........... 379/399.02; 341/144
See application file for complete search history.

(56) References Cited

U.S. PATENT DOCUMENTS

| | | | |
|---|---|---|---|
| 4,349,883 A | 9/1982 | Doljack | |
| 4,573,069 A | 2/1986 | Lewis, Jr. | |
| 5,233,309 A | 8/1993 | Spitalny et al. | |
| 5,325,071 A | 6/1994 | Westmoreland | |
| 5,408,999 A | 4/1995 | Singh et al. | |
| 5,486,791 A | 1/1996 | Spitalny et al. | |
| 5,615,256 A * | 3/1997 | Yamashita | 379/390.01 |
| 5,745,060 A | 4/1998 | McCartney et al. | |
| 5,999,059 A | 12/1999 | Blount, Jr. et al. | |
| 6,246,351 B1 * | 6/2001 | Yilmaz | 341/145 |
| 6,301,366 B1 * | 10/2001 | Malcolm et al. | 381/119 |
| 6,429,720 B1 | 8/2002 | Gilbert | |
| 6,445,248 B1 | 9/2002 | Gilbert | |
| 6,807,406 B1 * | 10/2004 | Razavi et al. | 455/313 |

OTHER PUBLICATIONS

Chang et al, "Analog Front End IC for 3G WCDMA", 2002, IEEE Symposium on VLSI Circuits Digest of Technical Papers; Jun. 13-15, 2002; pp. 28-31.*

* cited by examiner

*Primary Examiner*—Fan Tsang
*Assistant Examiner*—Ramnandan Singh
(74) *Attorney, Agent, or Firm*—Steven Lin, Esq.

(57) ABSTRACT

A gain or input volume controller and method includes a modified R2R ladder network having a number of R2R branches, switches coupled respectively to the R2R branches, and a switch controller for respectively controlling the switches to control and provide an overall gain value for a signal. The switch controller further includes a mapper for mapping a gain control signal to the switches wherein the gain control signal respectively activates or deactivates the switches. A fine gain control stage provides a fine gain control of the overall gain value. A coarse gain control stage is coupled to the fine gain control stage. The coarse gain control stage includes the modified R2R ladder network and provides a coarse gain control of the overall gain value.

22 Claims, 7 Drawing Sheets

GAIN OR INPUT VOLUME CONTROLLER AND METHOD UTILIZING A MODIFIED R2R LADDER NETWORK

BACKGROUND OF THE INVENTION

1. Field of the Invention

The present invention relates to a coder/decoder ("codec"), and, more particularly, to providing and operating an audio codec with a gain controller utilizing a modified R2R ladder network for controlling volume during playback of audio signals and for controlling gain of audio signals during a capture operation.

2. Description of Related Art

A (coder/decoder) ("codec") is considered to be any technology that encodes and decodes data. The encoding and decoding of data is useful and important to the processing of data in analog, digital, and mixed signal systems. Codecs may be implemented in software, hardware, or a combination of both software and hardware. Also, an exemplary type of audio codec is the audio codec ("AC") '97, which Intel Corporation has published in various revisions of the specification entitled Audio Codec '97 ("AC '97") (e.g., revision 2.2 in September 2000; revision 2.1 in May 22, 1998; revision 2.0 in Sep. 29, 1997; revision 1.03 in Sep. 15, 1996). The AC '97 specification and its various revisions are hereby incorporated by reference.

The AC '97 specification, revision 1.03 comprehensively defines a serial codec device that is designed to be utilized in systems in which audio signal processing and audio analog-to-digital (A/D) and digital-to-analog (D/A) conversions are performed in separate devices. The AC '97 specification, revision 2.0 is a follow-up revision to revision 1.03 and further defines the interface for a combined audio/telephony codec. Revision 2.0 also includes definitions for modem sample rate control, tagged data exchange using different sampling rates, general purpose input/output definitions, and extended AC-link definitions for multiple devices and power management event handling. Revision 2.1 updates revisions 1.03 and 2.0 by including some electrical and power management updates. Revision 2.2 provides further updates to revision 2.1 by adding optional S/PDIF support, standardized slot re-mapping, and updated electrical specification for better riser support.

Codecs typically require modules for input volume control and mixing of several analog input sources for a playback operation of an audio device. An input volume control is implemented with an operational amplifier ("op amp") and a resistor string. A codec may typically have ten to fourteen input volume control modules connected to the output mixer. Each input volume control module receives a gain control bit that is decoded to switch on a respective switch in the output mixer to set the appropriate gain. Each op amp in the input volume control module requires a calibration digital-to-analog converter (DAC) and respective logic for canceling offsets to minimize noise, such as pops and clicks, in the output signal. A gain control module similar to the input volume control module is utilized to mix analog input sources during the capture operation of the audio device. The gain control module also requires a calibration DAC and respective logic for canceling offsets that may occur during the mix and capture of the signals to minimize noise. However, op amps and calibration circuitry may consume a significant amount of die area. Therefore, a desire and need exist to provide input volume control modules or gain control modules that cancel offsets and minimize noise and that still do not consume a significant amount of die area.

The present invention recognizes the desire and need for providing an input volume controller or a gain controller that cancels offsets and reduces noise and that still consumes a low amount of die area. More specifically, the present invention provides an input volume controller or a gain controller that mixes and/or selects one of multiple analog sources with independent gain control using a modified R2R ladder scheme. The present invention overcomes the problems and disadvantages that have been encountered with the prior art.

SUMMARY OF THE INVENTION

A gain or input volume controller and method includes a modified R2R ladder network having a number of R2R branches, switches coupled respectively to the R2R branches, and a switch controller for respectively controlling the switches to control and provide an overall gain value for a signal. The switch controller further includes a mapper for mapping a gain control signal to the switches wherein the gain control signal respectively activates or deactivates the switches. A fine gain control stage provides a fine gain control of the overall gain value. A coarse gain control stage is coupled to the fine gain control stage. The coarse gain control stage includes the R2R ladder network and provides a coarse gain control of the overall gain value.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

The present invention is a gain or input volume controller and method that includes a modified R2R ladder network having a number of R2R branches, switches coupled respectively to the R2R branches, and a switch controller for respectively controlling the switches to control and provide an overall gain value for a signal. The following specification discloses the implementation of the present invention in terms of an exemplary audio codec according to the AC '97 codec specification or standard. As stated earlier, the AC '97 specification is a published and well-known standard, and the AC '97 specification and its various revisions are hereby incorporated by reference. However, even though the present invention is disclosed in terms of implementation in an exemplary audio codec according to the AC '97 specification, the present system and method are not in any way limited to just being utilized in a particular audio codec but may be implemented in any suitable codec.

Figure 1:
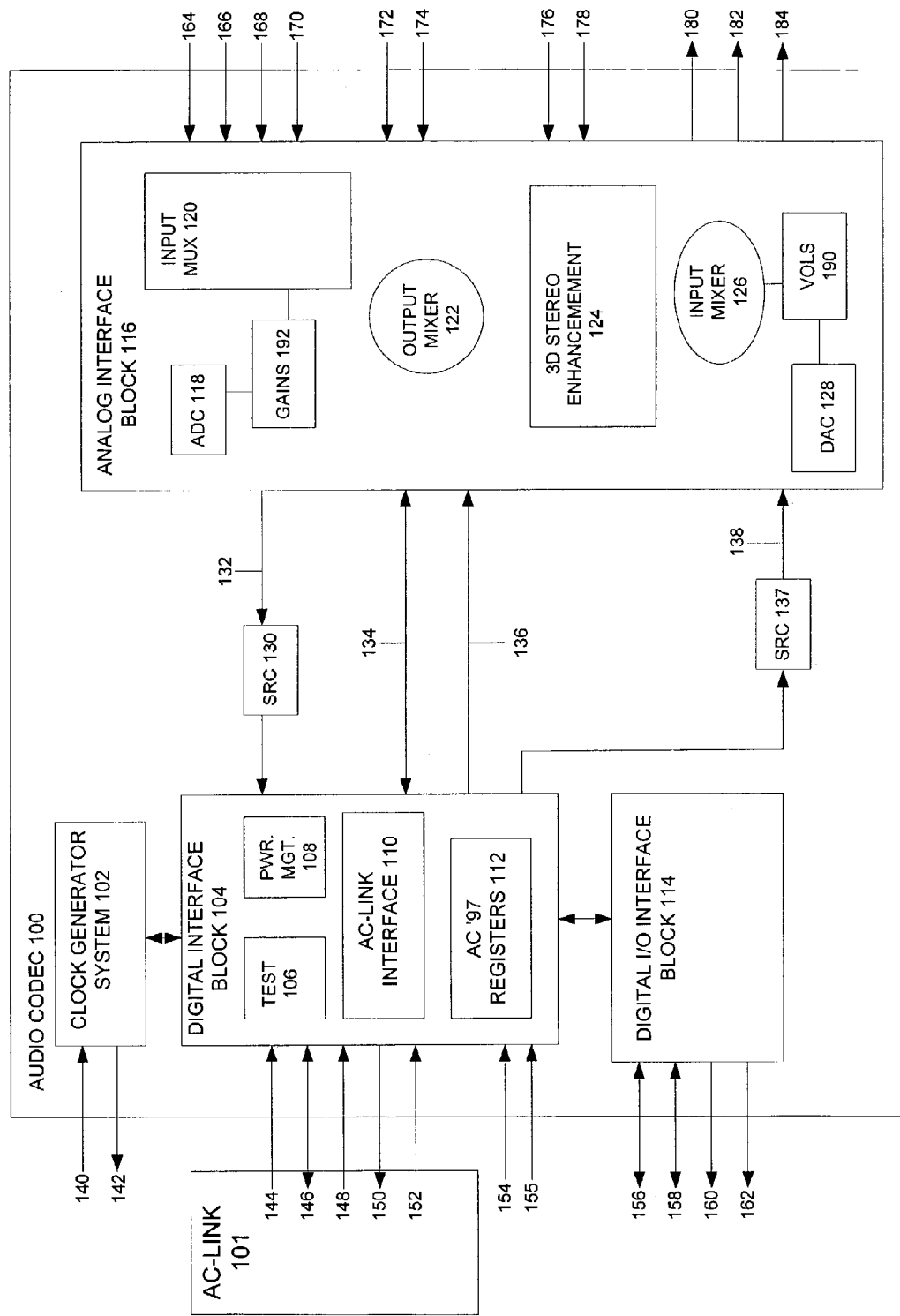
FIG. 1 is an exemplary block diagram of a codec that implements gain and input volume controllers according to the present invention.

With reference now to FIG. 1, an exemplary audio codec 100 according to the AC '97 specification is shown. Audio codec 100 has input volume controller modules ("VOLS") 190 and a gain controller module ("GAIN") 192 according to the present invention. Clock generator system 102 provides an operational clock signal for audio codec 100. Audio codec 100 has a crystal input ("XTL_IN") pin 140 and a crystal output ("XTL_OUT") pin 142. Clock generator system 102 interfaces and communicates with XTL_IN and XTL_OUT pins 140 and 142. XTL_IN pin 140 accepts either a clock generator oscillator, such as an external CMOS clock, or a crystal as the clock source for driving and operating audio codec 100. If a crystal drives audio codec 100, then the crystal is coupled between XTL_IN pin 140 and XTL_OUT pin 142. However, if a clock generator oscillator drives audio codec 100, then clock generator oscillator drives XTL_IN pin 140. In this case, XTL_OUT pin 142 is not connected to any component or device and is left floating.

Clock generator system 102 is coupled to a digital interface block 104. Digital interface block 104 contains a test block 106 that provides the specific device test functions for design verification and debug of audio codec 100 into a silicon design. Test block 106 also provides the test circuitry required for production testing and manufacturing stages of audio codec 100. Digital interface block 104 also has a power management control block 108 utilized for managing power usage by audio codec 100. Digital interface block 104 also includes an audio codec link ("AC-link") interface block 110 and an AC '97 registers block 112. AC '97 registers block 112 contains various registers defined by the AC '97 specification and standard. AC-link interface block 110 couples to an AC-link 101. AC-link 101 is a point-to-point link between audio codec 100 and audio codec controller 624 in FIG. 6. Audio codec controller 624 controls operations of audio codec 100.

AC-link 101 includes a serial port sync pulse input ("SYNC") pin 144, a serial port master clock input/output ("BIT_CLK") pin 146, a serial data input stream to audio codec input ("SDATA_OUT") pin 148, a serial data output stream to audio codec output ("SDATA_IN") pin 150, and a reset input ("RESET#") pin 152. SYNC pin 144 provides the serial port timing signal for audio codec 100. BIT_CLK pin 146 provides the input/output signal, which controls the master clock timing for AC-link 101. SDATA_OUT pin 148 provides the input signal that is transmitted to control information and digital audio output streams, which are sent to the digital-to-analog converters ("DACs") of DAC block 128. The data is clocked into audio codec 100 on the falling edge of the BIT_CLK signal. SDATA_IN pin 150 provides the output signal that transmits the status information and digital audio input streams from the analog-to-digital converters ("ADCs") of ADC block 118. The data is clocked from audio codec 100 on the rising edge of the BIT_CLK signal. RESET# pin 152 resets audio codec 100 before entering into the normal operational mode.

Audio codec 100 also has an identification ("ID0#") pin 154 and another identification ("ID1#") pin 155, which interface with digital interface block 104. Values assigned to ID0# and ID1# pins 154 and 155 may be utilized to determine the mode of operation (e.g., primary/master mode or secondary/slave mode) of audio codec 100 and the clock source for providing the clock signal with the desired clock rate to audio codec 100.

Digital interface block 104 is coupled to a digital input/output ("I/O") interface block 114. Digital I/O interface block 114 digitally interfaces with input and output devices through I/O pins such as the following exemplary pins: a general purpose I/O or left-right clock I/O ("GPIO0/LRCLK") pin 156, a general purpose I/O or serial data output I/O ("GPIO1/SDOUT") pin 158, an external amplifier power down or serial clock output ("EAPD/SCLK") pin 160, and a Sony/Phillips Digital Interface Output or Serial Data Output 2 output ("SPDO/SDO2") pin 162.

GPIO0/LRCLK pin 156 is a general purpose I/O pin that is utilized to interface with external circuitry. GPIO0/LRCLK pin 156 also provides the left-right ("L/R") clock for both serial data ports under certain conditions. GPIO1/SDOUT pin 158 is another general purpose I/O pin that is also used to interface with external circuitry. GPIO1/SDOUT pin 158 also provides the serial data for the first serial data port under certain conditions. EAPD/SCLK pin 160 is utilized to control the power-down state of an external amplifier. EAPD/SCLK pin 160 also provides the serial clock for both serial data ports. SPDO/SDO2 pin 162 generates the digital output for the Sony/Phillips digital interface output ("S/PDIF") from audio codec 100 under certain conditions. SPDO/SDO2 pin 162 also provides the serial data for the second serial data port under certain conditions. Digital I/O interface block 114 is utilized to connect audio codec 100 to consumer electronic equipment and devices. Digital I/O interface block 114 contains a serial port that is utilized to interface audio codec 100 with one or two external stereo digital-to-analog converters ("DACs").

An analog interface block 116 is coupled to digital interface block 104. Analog interface block 116 operates at a fixed sample rate, such as 48 KHz. Gain and/or mute control signals 134 and mixer and/or multiplexer ("mux") select signals 136 are communicated between digital interface block 104 and analog interface block 116. Data 132 is transmitted from analog interface block 116 to digital interface block 104, and data 138 is transmitted from digital interface block 104 to analog interface block 116. The SRC system includes a sample rate converter ("SRC") 130 coupled in the data transmission path after the ADCs of ADC block 118 for providing the required sample rate from fixed sample rate of data 132 from the ADCs. The SRC system further includes another SRC 137 coupled in the data transmission path before the DACs of DAC block 128 for providing the data at 48 KHz rate 138 to the DACs.

Analog interface block 116 contains the analog circuitry for providing the audio functions of audio codec 100. Analog interface block 116 includes ADC block 118, an input multiplexer ("MUX") 120, an output mixer 122, a 3-D stereo enhancement block 124, an input mixer 126, and a DAC block 128. GAIN 192 is coupled between ADC 118 and input MUX 120 for controlling the gain of the signal being provided during a capture operation. VOLS 190 is coupled between DAC 128 and input mixer 126 for controlling the volume of a signal being provided during a playback operation.

Analog interface block 116 is coupled to and interfaces with various pins such as the following exemplary pins: line input ("LINE") pins 164, compact disk ("CD") audio input pins 166, auxiliary ("AUX") input pins 168, video ("VIDEO") audio input pins 170, a primary microphone ("MIC1") pin 172, a secondary microphone ("MIC2") pin 174, a speakerphone input ("PHONE") input pin 176, a personal computer beep speaker input ("PC_BEEP") pin 178, line level output ("LINE_OUT") pins 180, headphone output ("HP_OUT") pins 182, and a speakerphone output ("MONO_OUT") pin 184.

LINE pins 164 receive analog inputs, which provide a pair or stereophonic sources to analog output mixer 122 and may be used for an auxiliary external audio source. CD audio input pins 166 receive analog inputs that also provide a pair or stereophonic sources to analog output mixer 122 and may be used for a CD audio source. AUX input pins 168 receive analog inputs that are a pair or stereophonic sources to analog output mixer 122 and may be used for an auxiliary internal or external audio source. VIDEO audio input pins 170 receive analog inputs that are a pair or stereophonic sources to analog output mixer 122 and may be used for the audio signal output of a video device.

MIC1 pin 172 receives an analog input that is a monophonic source to analog output mixer 122 and may be used for a desktop microphone. MIC2 pin 174 receives an analog input that is a monophonic source to analog output mixer 122 and may be used for a headset or alternate microphone. PHONE pin 176 receives an analog input that is a monophonic source to analog output mixer 122 and may be used for the audio signal output of a telephony device. PC_BEEP pin 178 receives the analog input that is intended to pass the Power On Self-Test ("POST") tones of a personal computer to the audio subsystem. LINE_OUT pins 180 provides the analog line output signals from stereo input mixer 126. HP_OUT pins 182 outputs the analog headphone output signals from stereo input mixer 126. MONO_OUT pin 184 provides the analog output signal from the stereo-to-mono mixer 126.

Figure 2:
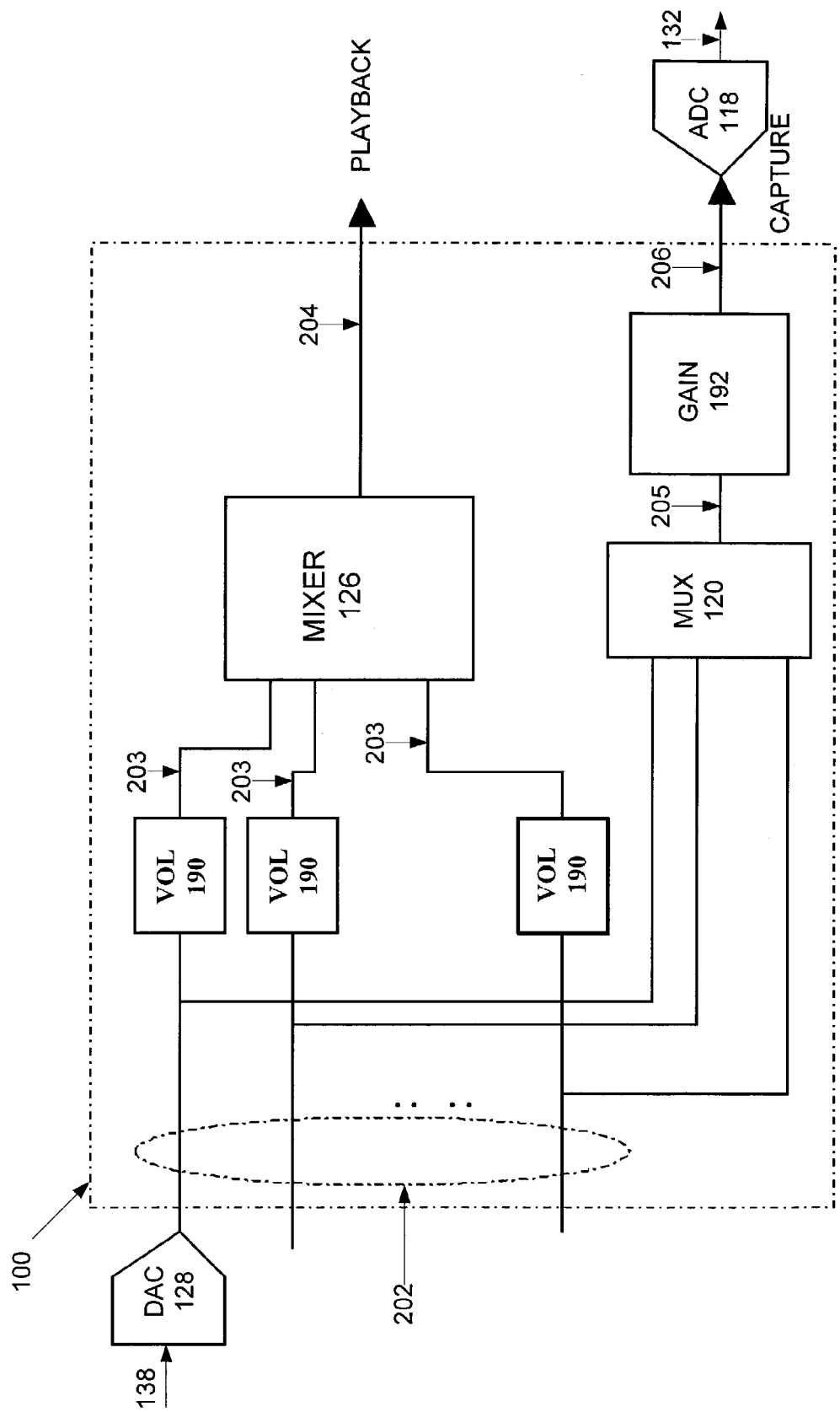
FIG. 2 is an exemplary block diagram of a portion of the codec in FIG. 1 illustrating the capture and playback operations through respective gain and input volume controllers.

Referring now to FIG. 2, a portion of audio codec 100 in FIG. 1 illustrating the capture and playback operations through respective GAIN 192 and VOLS 190 is shown in more detail. A number of individual input volume controller modules ("VOLs") 190 are coupled between DAC 128 and input mixer 126. A gain controller ("GAIN") 192 is coupled between input MUX 120 and ADC 118. In FIG. 2, data 138, which is digital data transmitted from digital interface block 104 to analog interface block 116, are received by DAC 128. DAC 128 converts the digital data 138 to analog data signals 202. Analog data signals 202 are fed to respective VOLS 190. VOLS 190 control the volume gain of analog data signals 202 to produce volume-controlled signals 203. Volume controlled signals 203 are input into input mixer 126, which selects and mixes the signals accordingly to produce a mixed analog audio output signal 204, which is utilized for playback during a playback operation of an audio system, such as audio system 600 in FIG. 6.

With further reference to FIG. 2, analog data signals 202 are also fed into input MUX 120. Input MUX 120 selects corresponding analog data signal(s) 202 and outputs selected analog data signal 205 for capture during a capture operation of an audio system 600. Selected analog data signal 205 is input into GAIN 192 to control the gain value of the selected signal, and GAIN 192 provides gain controlled analog signal 206. The present invention provides the advantage of mixing and/or selecting one of multiple analog sources with independent gain control by VOLs 190 and GAIN 192, which each generally uses a modified R2R ladder network and an operational amplifier to accomplish such gain control. ADC 118 receives and converts gain controlled analog signal 206 into digital data 132, which is transmitted from analog interface block 116 to digital interface block 104 as shown in FIG. 1. Audio digital data 132 is then captured during a capture operation of an audio system, such as audio system 600 in FIG. 6.

Figure 3:
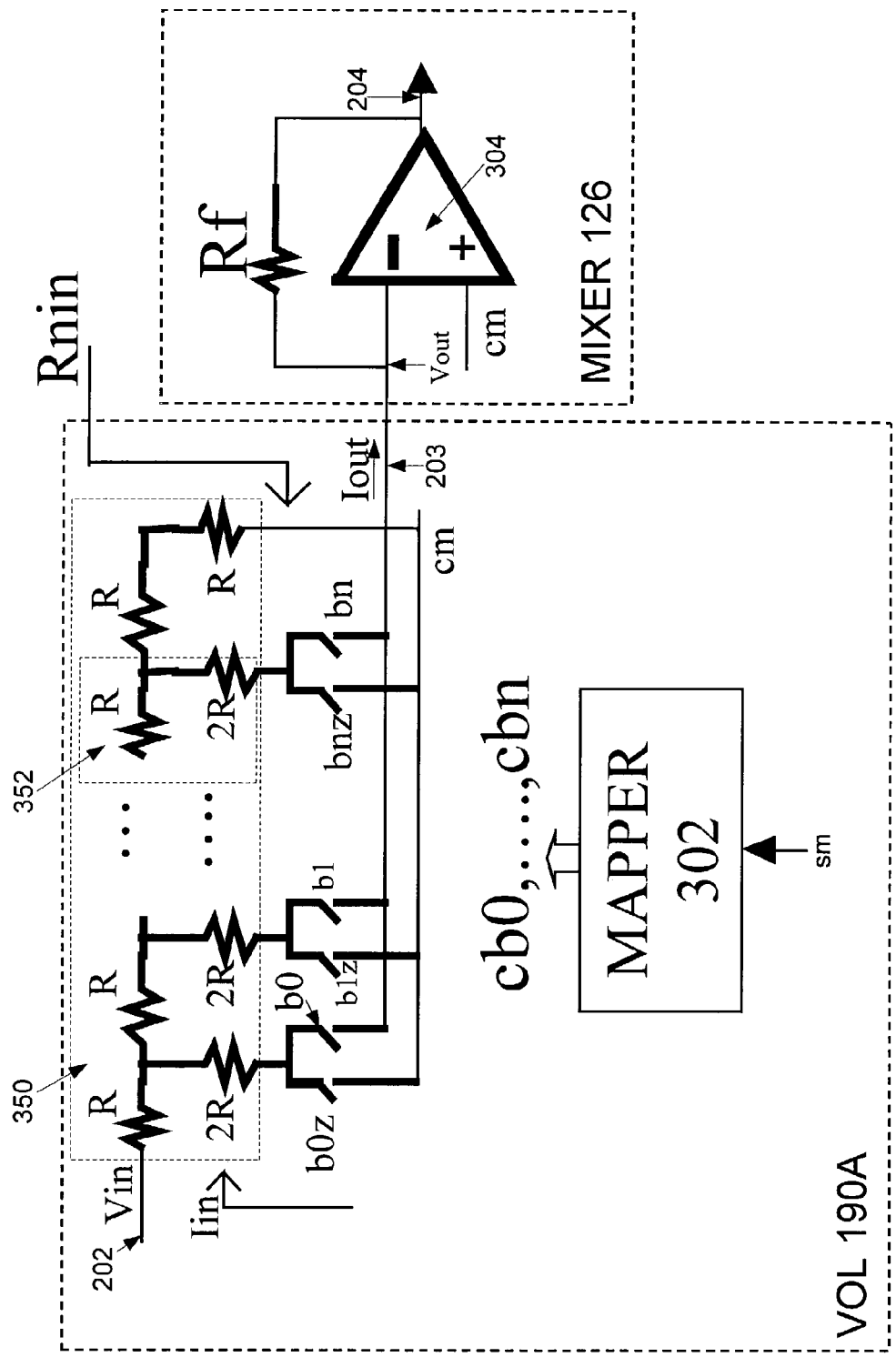
FIG. 3 is an exemplary embodiment of an input volume controller that is shown in more detail and may be used in the codec of FIGS. 1 and 2 for playback operations.

With reference now to FIG. 3, one exemplary block diagram of an input volume controller ("VOL") 190A is shown coupled to a mixer 126. VOL 190A has a modified R2R ladder network 350 with an n number of R2R branches 352 in which n is an integer equal or greater than one. Each R2R branch 352 includes a resistor R having a resistor value "R" and another resistor 2R, which has a resistor value "2R", which is twice the resistor value "R". Resistor R is one among a series of resistors R in R2R ladder network 350. Resistor 2R has one end coupled to an end of resistor R and another end coupled to either a common mode (voltage) cm or the output end of output path Vout. A pair of switches b0z, b0; b1z, b1; ... ; bnz, bn is respectively coupled into each R2R branch 352 of R2R ladder network 350. Switches b0z, b1z, ... , bnz are each coupled between an end of the respective resistor 2R and common mode cm. Switches b0, b1, ... , bn are each coupled between the end of the respective resistor 2R and an output path that provides an output current signal Iout having the overall gain for the volume controlled signal 203 of FIG. 2.

The input voltage Vin and the input current Iin of analog data signals 202 of FIG. 2 are identified in R2R ladder network 350 as shown in FIG. 3. VOL 190A further has a mapper 302 for mapping a gain control signal sm having m bits into n number of control bits cb0, cb1, ... , cbn to control activation or deactivation of respective switches b0z, b0; b1z, b1; ... ; bnz, bn. For example, m bits may be 5 bits, and n number of control bits may be 10 to 11 control bits. In this example, mapper 302 would need to map 5 bits of the gain control signal sm into 10 to 11 control bits cb0, cb1, ... , cb9 or cb10. The selection/non-selection of the respective switches b0z, b0; b1z, b1; ... ; bnz, bn results in the providing of a corresponding gain value by VOL 190A.

The output of VOL 190A is fed into a mixer 126. Mixer 126 includes an operational amplifier ("op amp") 304 and a feedback resistor Rf coupled from an output of op amp 304 to a negative input of op amp 304 as shown in FIG. 3. The positive input of op amp 304 is coupled to common mode cm. VOL 190A accordingly generates a current Iout for providing volume-controlled signal 203. As indicated earlier, the voltage Vin and respective current Iin into the input of VOL 190A are from analog data signals 202. Mixer 126 generates an audio output signal 204. A voltage Vout is associated with the current Iout since Vout=Rf*Iout. A suitable value for feedback resistor Rf is selected to provide the proper gain value.

As some of the switches b0z, b0; b1z, b1; ... ; bnz, bn simultaneously turn on and off, glitches may occur during some of the transitions. Noise at the audio output signal 204 may be from op amp 304 and the various resistors shown in FIG. 3. The noise is proportional to Rnin/Rf in which resistance Rnin is the equivalent resistance looking into the structure of VOL 190A as shown in FIG. 3. Resistance Rnin is generally insensitive to the different gain settings. Feedback resistor Rf generally needs to be made smaller for a better signal-to-noise ratio (SNR). The Rnin and Rin values (e.g., Vin and Iin) are seen equivalently through the ends of R2R ladder network 350. Another advantage of the present invention is that the values for Rnin, Rin, and Rf of the op amp based gain control can be selected by a designer's criteria to provide a desired noise minimization aspect.

Figure 4:
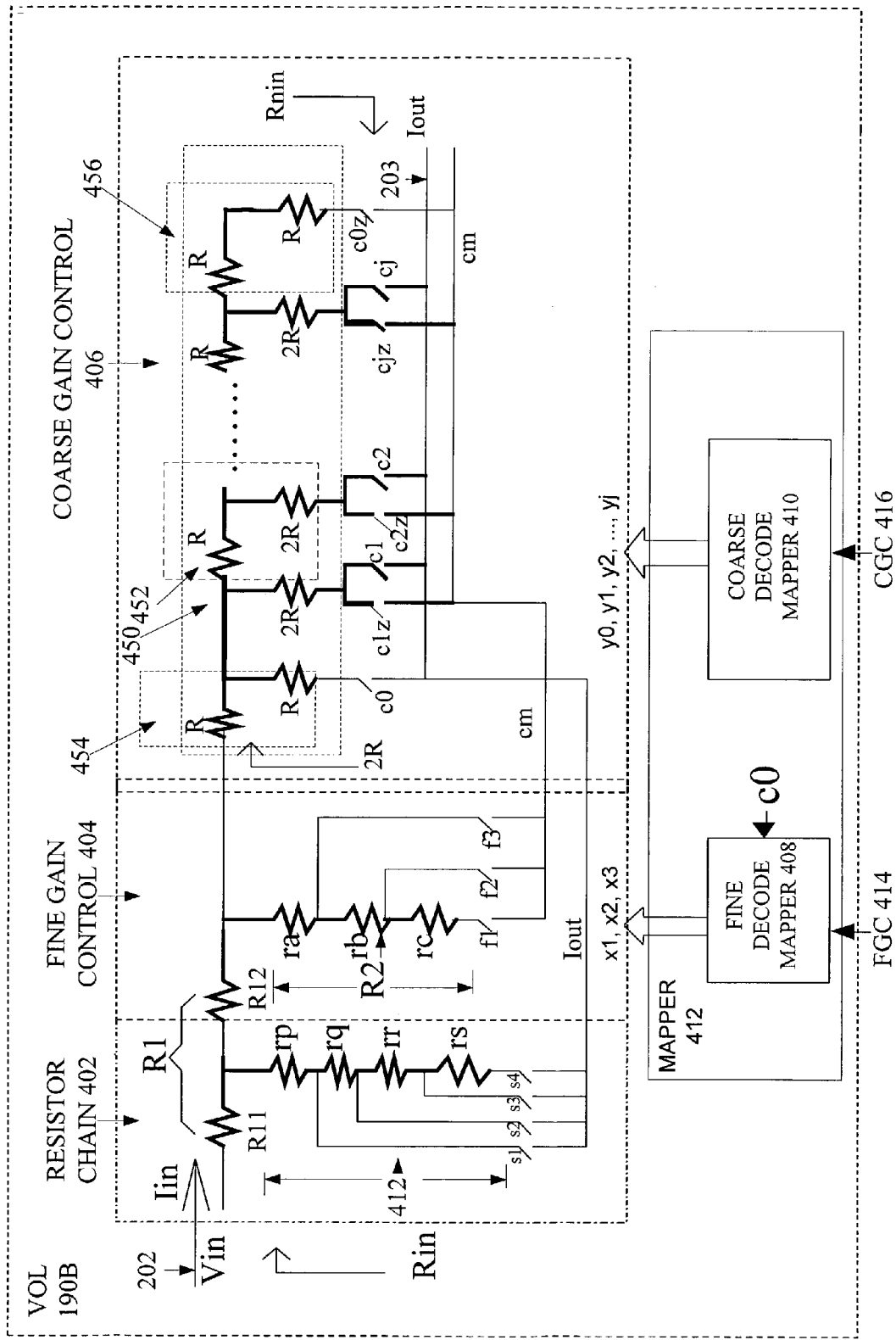
FIG. 4 is another exemplary embodiment of an input volume controller that is shown in more detail and may be used in the codec of FIGS. 1 and 2 for playback operations.

Referring now to FIG. 4, another exemplary block diagram of an input volume controller ("VOL") 190B is shown. VOL 190B may be used in the playback operations of audio codec 100 as shown in FIGS. 1 and 2. VOL 190B may be coupled to an input of mixer 126 as similarly shown in FIG. 3. VOL 190B has a resistor chain 402, a fine gain control 404, and a coarse gain control 406.

Resistor chain 402 includes a resistor R11 coupled in series with a resistor R12 of fine gain control 404 and the series of resistors R of modified R2R ladder network 450 as shown in FIG. 4. Resistor chain 402 also has a selectable resistor path 412 coupled to an end of resistor R11. Selectable resistor path 412 has resistors rp, rq, rr, and rs having respective resistance values "rp", "rq", "rr", and "rs" coupled together in series. An end of switch s1, s2, and s3 is respectively coupled between a corresponding node between resistors rp, rq, rr, and rs, and an end of switch s4 is coupled to the other end of resistor rs. Another end of switch s1, s2, s3, and s4 is each coupled to the output path Iout as shown in FIG. 4. Only one switch s1, s2, s3, or s4 is activated at a time. When an individual switch s1, s2, s3, or s4 is respectively activated, then selectable resistor path 412 provides corresponding resistance rp, rp+rq, rp+rq+rr, or rp+rq+rr+rs. Thus, the resistance value that selectable resistor path 412 provides depends upon the switch s1, s2, s3, or s4 that is selected for activation.

Fine gain control 404 includes a resistor R12 coupled in series with resistor R11 of resistor chain 402 and the series of resistors R of R2R ladder network 450 as shown in FIG. 4. Fine gain control 404 also has a selectable resistor path R2 coupled to an end of resistor R12. Selectable resistor path R2 has resistors ra, rb, and rc having respective resistance values "ra", "rb", and "rc" coupled together in series. An end of switch f1, f2, and f3 is respectively coupled to an end of resistor rc, at a node between resistors rc and rb, and at a node between resistors rb and ra. Another end of switch f1, f2, and f3 is each coupled to the common mode cm as shown in FIG. 4. Only one switch f1, f2, and f3 is activated at a time. When an individual switch f1, f2, or f3 is respectively activated, then selectable resistor path R2 provides corresponding resistance ra+rb+rc, ra+rb, ra. Thus, the resistance value, that selectable resistor path R2 provides, depends upon the switch f1, f2, or f3 that is selected for activation.

Coarse gain control 406 has an R2R ladder network 450 similar to the R2R ladder network 350 as shown in FIG. 3. R2R ladder network 450 has a j number of R2R branches 452 in which j is an integer equal or greater than one. Each R2R branch 452 includes a resistor R having a resistor value "R" and another resistor 2R, which has a resistor value "2R", which is twice the resistor value "R". Resistor R is one among a series of resistors R in R2R ladder network 450. Resistor 2R has one end coupled to an end of resistor R and another end coupled to a common mode (voltage) cm. A pair of switches c1z, c1; c2z, c2; ... ; cjz, cj is respectively coupled into each R2R branch 452. Switches c1z, c2z, ... , cjz are each coupled between an end of the respective resistor 2R and common mode cm. Switches c1, c2, ... , cj are each coupled between the end of the respective resistor 2R and an output path that provides an output current signal Iout having the overall gain for the volume controlled signal 203 of FIG. 2.

R2R ladder network 450 differs from R2R ladder network 350 of FIG. 3 in that R2R ladder network 450 also has a first RR branch 454 at the front or input end and a second RR branch 456 at the back or output end as shown in FIG. 4. Each RR branch 454 or 456 includes a resistor R, which has a resistor value "R", and another resistor R, which also has a resistor value "R", that are coupled together as shown in FIG. 4. A switch c0 has one end coupled in series with resistor R of RR branch 454 and the other end of switch c0 coupled to an output end (e.g., output current Iout) of the output path. Another switch c0z has one end coupled in series with the other resistor R of RR branch 456 and the other end of switch c0z coupled to the common mode cm.

VOL 190B also has a mapper 412. Mapper 412 includes a fine decode mapper 408 and a coarse decode mapper 410. Mapper 412 maps fine and coarse gain control signals ("FGC") 414 and ("CGC") 416, which together have m bits, into n number of control bits x1, x2, x3, y0, y1, ... , yj, in which n equals j+4 (e.g., four is derived from the three bits of fine gain control 404 and the one bit for switches c0 and c0z), to control activation or deactivation of respective switches f1, f2, f3; c0, c0z; c1, c1z; ... ; cj, cjz. Fine decode mapper 408 maps FGC 414 into control bits x1, x2, and x3 to control activation or deactivation of respective switches f1, f2, and f3. Coarse decode mapper 410 maps CGC 416 into control bits y0, y1, ... , yj to control activation or deactivation of respective switches c0, c0z; c1, c1z; ... ; cj, cjz. The selection/non-selection of the respective switches f1, f2, f3, c0, c0z, c1, c1z, ... , cj, cjz results in the providing of a corresponding gain value by VOL 190B.

As shown in FIG. 4, respective input voltage Vin and input current Iin are at the input end (e.g., at the input of resistor chain 402) of VOL 190B. As indicated earlier, the resistance value R2 is provided by selectable resistor path R2. The resistor values for resistors Rin and R2 may be determined according to the following equations (1) and (2):

$$Rin = \frac{R1*(R1+2*R)}{R1+2*(1-Gf)*R} \quad (1)$$

$$R2 = \frac{Gf*(R1\|(2*R))}{1-Gf} \quad (2)$$

wherein resistors R1 and R have been described earlier and gain Gf is the fin gain from fine gain control 404 in a linear scale.

Coarse gain control 406 may provide multiples of −6 dB gains while fine gain control 404 may provide gains of 0, −1.5 dB, −3.0 dB, −4.5 dB. The output of VOL 190B may be similarly fed into a mixer 126 as shown in FIG. 3. Splitting the gain bits into coarse and fine stages simplifies the decoding logic. Also, in the coarse gain control 406, additional branch 454 having resistor R and switch c0 and further additional branch 456 with resistor R and switch c0z both provide the gain of 0 dB instead of having to turn on all R2R branches 452. The provision of these additional branches 454 and 456 and the activation of only one R2R branch 452 at a time help lower the matching requirements of modified R2R ladder network 450 and minimize glitches that could occur if multiple switches were to be simultaneously activated or deactivated. Furthermore, all switches f1, f2, f3, c0, c0z, c1, c1z, ... , cj, cjz are fixed to the common mode voltage cm, and the switches realize minimal signal dependency. Small sized switches f1, f2, f3, c0, c0z, c1, c1z, ..., cj, cjz are able to provide an acceptable gain error, and the present invention provides a low distortion gain control. Thus, the present invention provides the feature and advantage of a log linear gain selection having a fine and coarse control with the modified R2R ladder network 450.

The output of VOL 190B may be fed into mixer 126. Resistor chain 402 is combined with fine gain control 404 and coarse gain control 406 in order to further improve the signal-to-noise ("SNR") and further reduce the value of input resistor Rin in mixer 126 of FIG. 3. For example, VOL 190B without resistor chain 402 would provide gains of +6 dB to −34.5 dB, and VOL 190B with resistor chain 402 provides gains of +12 dB to +7.5 dB (+12 dB, +10.5 dB, +9.0 dB, +7.5 dB). Resistor chain 402 may be designed to meet specifications for resistor Rin and generate higher output currents Iout for higher gain. The above combination can be appropriately modified if resistor chain 402 needs to provide other gains. Also, resistor Rnin is the equivalent resistance looking into the structure of VOL 190B as shown in FIG. 4, and Rnin is generally insensitive to the different gain settings. Again, the Rnin and Rin values (e.g., Vin and Iin) are seen equivalently through the respective input end of resistor chain 402 and output end of R2R ladder network 450. Another advantage of the present invention is that the values for Rnin, Rin, and Rf of the op amp based gain control can be selected by a designer's criteria to provide a desired noise minimization aspect.

Figure 5:
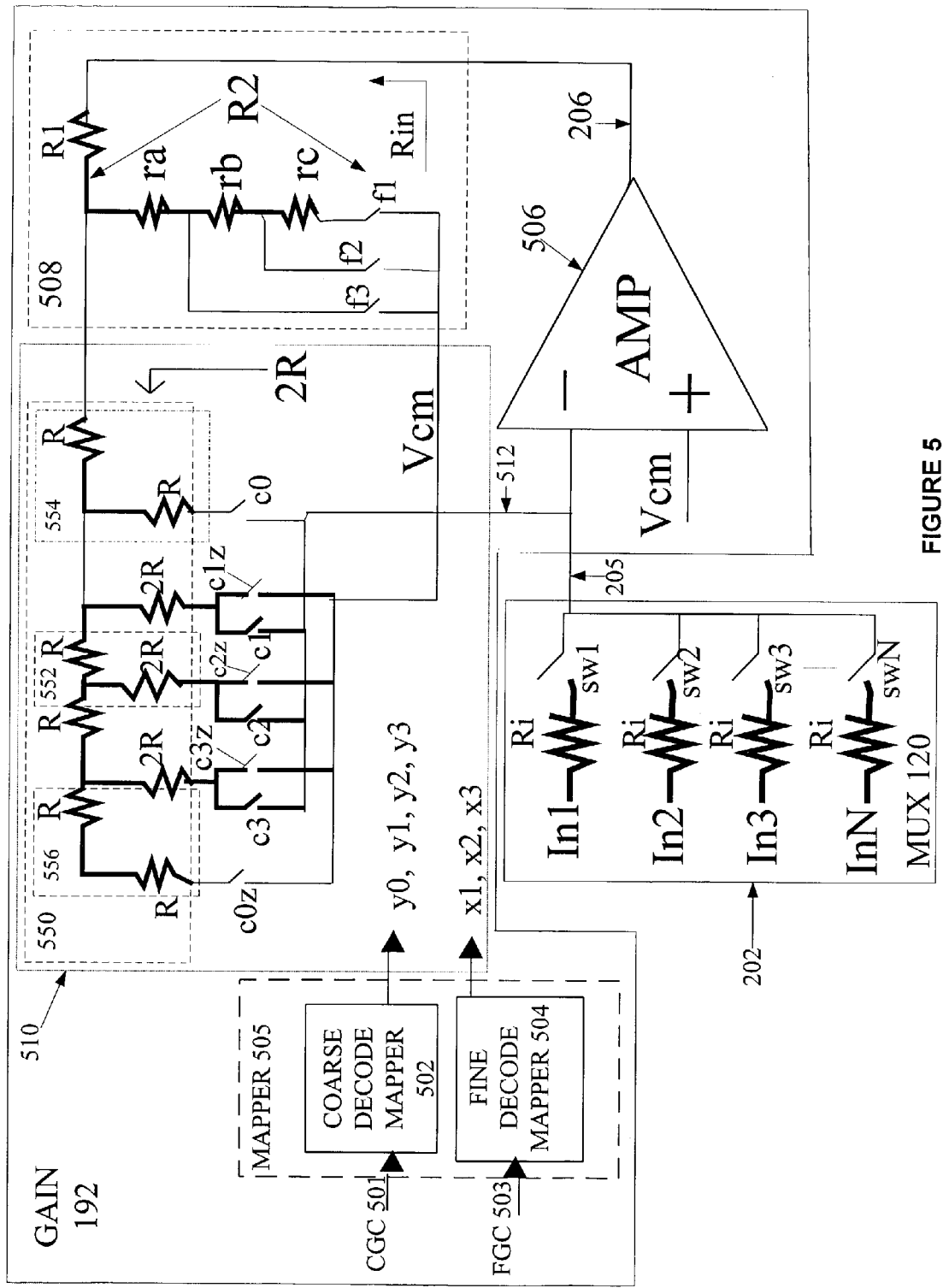
FIG. 5 is an exemplary block diagram of a gain controller that is shown in more detail and may be used in the codec of FIGS. 1 and 2 for capture operations.

With reference now to FIG. 5, a gain controller ("GAIN") 192 is shown in more detail. GAIN 192 may be used in the capture operations of audio codec 100 shown in FIGS. 1 and 2. MUX 120 is also shown in more detail. MUX 120 receives analog data signals 202 and selects the respective input signals In1, In2, In3, ..., InN to provide selected analog data signal 205 to be captured by audio codec 100. MUX 120 has a respective resistor Ri coupled to each switch sw1, sw2, sw3, ..., swN for corresponding input signal In1, In2, In3, ..., InN of analog data signals 202. Input signal In1, In2, In3, ... or, InN is fed into respective resistor Ri, which is coupled to corresponding switch sw1, sw2, sw3, ..., swN. MUX 120 activates the switches for those input signal(s) to be selected to provide selected analog data signal 205, which is gain controlled by GAIN 192.

GAIN 192 has an operational amplifier ("op amp") 506. A positive input of op amp 506 is coupled to common mode (cm) voltage Vcm. A negative input of op amp 506 receives selected analog data signal 205 and feedback signal 512 from coarse gain control 510 as shown in FIG. 5. Op amp 506 outputs a gain controlled analog signal 206, which is fed into and received by fine gain control 508.

Fine gain control 508 is similar to fine gain control 404 in FIG. 4. Fine gain control 508 includes a resistor R1, which is similar to resistor R1 in fine gain control 404, coupled in series with the series of resistors R of R2R ladder network 550 as shown in FIG. 5. Fine gain control 508 also has a selectable resistor path R2, which is the same as selectable resistor path R2 of fine gain control 404, coupled to an end of resistor R1. The description for fine gain control 404 was previously stated above.

Coarse gain control 510 is similar to coarse gain control 406 in FIG. 4. Coarse gain control 510 has a modified R2R ladder network 550 similar to the R2R ladder network 450 as shown in FIG. 4. R2R ladder network 550 has a j number of R2R branches 552 in which j may be an integer equal or greater than one. In this exemplary embodiment of coarse gain control 510, j is equal to three (3). Each R2R branch 552 includes a resistor R having a resistor value "R" and another resistor 2R, which has a resistor value "2R", which is twice the resistor value "R". Resistor R is one among a series of three resistors R in R2R ladder network 550. Resistor 2R has one end coupled to an end of resistor R and another end coupled to either a common mode (voltage) cm or the negative input of op amp 506. A pair of switches c1z, c1; c2z, c2; or c3z, c3 is respectively coupled into each R2R branch 552. Switches c1z, c2z, c3z are each coupled between an end of the respective resistor 2R and common mode voltage Vcm. Switches c1, c2, c3 are each coupled between the end of the respective resistor 2R and in line with feedback signal 512 to selected analog data signal 205.

R2R ladder network 550 also has a first RR branch 554 at the feedback input end and a second RR branch 556 at the feedback output end as shown in FIG. 5. Each RR branch 554 or 556 includes a resistor R, which has a resistor value "R", and another resistor R, which also has a resistor value "R", that are coupled together as shown in FIG. 5. A switch c0 has one end coupled in series with resistor R of RR branch 554, and the other end of switch c0 coupled in line with feedback signal 512 to selected analog data signal 205. Another switch c0z has one end coupled in series with the other resistor R of RR branch 556 and the other end of switch c0z coupled to the common mode voltage Vcm.

GAIN 192 also has a mapper 505. Mapper 505 includes a coarse decode mapper 502 and a fine decode mapper 504. Mapper 505 maps coarse and fine gain control signals ("CGC") 501 and ("FGC") 503, which together have m bits, into n (=7) number of control bits x1, x2, x3, y0, y1, y2, y3 to control activation or deactivation of respective switches f1, f2, f3; c0, c0z; c1, c1z; c2, c2z; c3, c3z. Fine decode mapper 504 maps FGC 503 into the three control bits x1, x2, and x3 to control activation or deactivation of respective switches f1, f2, and f3. Coarse decode mapper 502 maps CGC 501 into control bits y0, y1, y2, and, y3 to control activation or deactivation of respective switches c0, c0z; c1, c1z; c2, c2z; c3, c3z. The selection/non-selection of the respective switches f1, f2, f3; c0, c0z; c1, c1z; c2, c2z; c3, c3z results in the providing of a corresponding gain value by GAIN 192.

The resistor values for resistors Rin and R2 may similarly be determined according to the above equations (1) and (2). Splitting the gain bits into coarse and fine stages simplifies the decoding logic. Also, in the coarse gain control 510, additional branch 554 having resistor R and switch c0 and further additional branch 556 with resistor R and switch c0z provides the gain of 0 dB instead of having to turn on all R2R branches 552. The provision of these additional branches 554 and 556 and the activation of only one R2R branch 552 at a time help lower the matching requirements of R2R ladder network 550 and minimize glitches that could occur if multiple switches were to be simultaneously activated or deactivated. Furthermore, all switches f1, f2, f3, c0, c0z, c1, c1z, c2, c2z, c3, c3z are fixed to the common mode voltage Vcm, and the switches realize minimal signal dependency. Small sized switches f1, f2, f3, c0, c0z, c1, c1z, c2, c2z, c3, c3z are able to provide an acceptable gain error, and the present invention provides a low distortion gain control. Thus, the present invention provides the further feature and advantage of mixing various analog sources in a single op amp stage and using a modified R2R ladder network in the feedback path of the op amp for gain variation.

Figure 6:
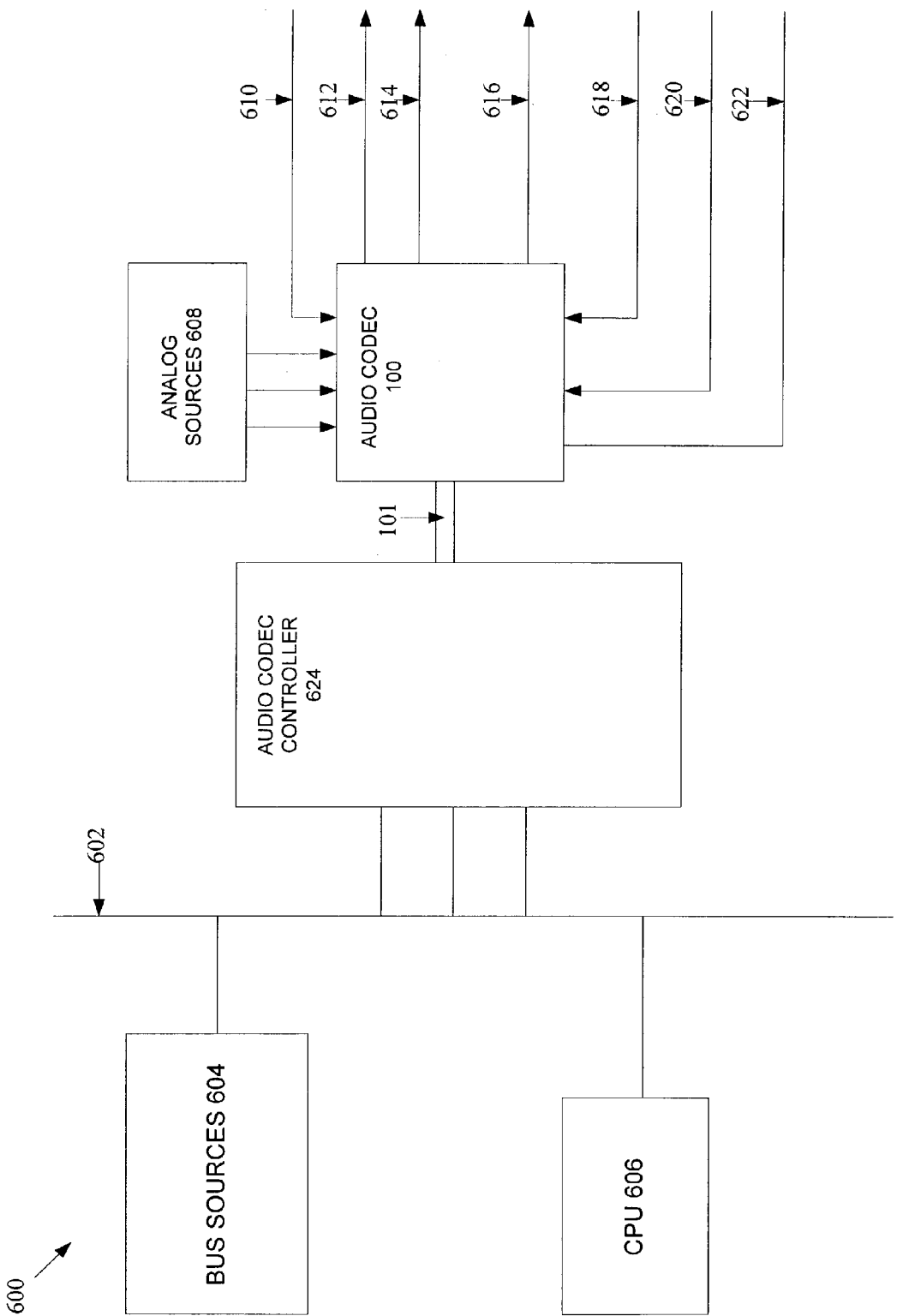
FIG. 6 is an exemplary block diagram of an audio system that implements the codec of FIG. 1 according to the present invention.

Referring now to FIG. 6, an audio system 600 that implements audio codec 100 having VOLS 190 and GAINS 192 according to the present invention is shown. Audio system 600 may be the audio sub-system for a personal computer or the audio system for a consumer set-top box, a portable audio device, a handheld computing device, or other devices with AC-link support. Audio system 600 includes audio codec controller 624 coupled to audio codec 100 through an AC-link 101. Audio codec controller 624 is further coupled to a system bus 602, such as a peripheral component interconnect ("PCI") bus.

Bus sources 604 and a central processing unit ("CPU") 606 are coupled to system bus 602. Bus sources 604 include audio sources from audio applications, game applications, digital compact disk and digital video disk (CD/DVD) applications, soft MPEG, AC-3, and other such applications, and digital music (e.g., MP3) applications. Audio codec 100 receives analog signals from various analog sources 608. Exemplary analog sources 608 include Redbook audio signals from a CD/DVD player, video audio signals from a television tuner, and audio signals from an internal source through an auxiliary ("AUX") input. Audio codec 100 in FIG. 6 is configured to have the following exemplary inputs and outputs: LINE_IN signal 610, LINE_OUT signal 612, AUX_OUT signal 614, SPDIF_OUT signal 616, MIC_IN signal 618, PHONE signal 620, and MONO_OUT signal 622.

LINE_IN signal 610 is an analog input signal from an auxiliary external audio source to output mixer 122. LINE_OUT signal 612 is an analog output from input mixer 126. AUX_OUT signal 614 is an analog output from input mixer 126 for an auxiliary device. Exemplary AUX_OUT signals 614 are included but not limited to a line level output ("LNLVL_OUT") signal, a headphone output ("HP_OUT") signal, or a 4-channel output ("4CH_OUT") signal. SPDIF_OUT signal 616 is a S/PDIF digital output from audio codec 100 that may be used to directly drive a resistive divider and coupling transformer to an RCA-type connector for use with consumer audio equipment. MIC_IN signal 618 is an analog input from a microphone that provides a monophonic source to output mixer 122. PHONE signal 620 is an analog input from a telephony device that-provides a monophonic source to input mixer 126. MONO_OUT signal 622 is an analog output from a stereo-to-mono mixer.

Audio codec 100 in audio system 600 performs DAC and ADC conversions and mixing functions and provides analog input/output ("I/O") capabilities for audio or modem signals. Audio codec 100 operates as a slave device to audio codec controller 624, which is typically either a discrete peripheral component interface ("PCI") accelerator or a controller that is integrated within a core logic chipset. AC-link 101 is a digital link that is in a bi-directional, 5-wire serial Time Division Multiplexing ("TDM") format interface. AC-link 101 typically supports connections between a single audio codec controller 624 and up to four audio codecs 100 on a circuit board or riser card.

Audio system 600 provides various audio output options, such as analog stereo output, amplified analog stereo headphone output, discrete analog 4-channel output, analog matrix-encoded surround output, and digital 5.1 channel output. Analog stereo output is a LINE_OUT signal 612 that is transmitted to amplified stereo PC speaker array via a stereo mini-jack. Amplified analog stereo headphone output is a HP_OUT signal (e.g., AUX_OUT signal 614) transmitted to a headphone or headset through a stereo mini-jack. Discrete analog 4-channel output are a LINE_OUT signal 612 and a 4CH_OUT signal (e.g., AUX_OUT signal 614) that are transmitted to front and surround amplified speaker arrays via dual stereo mini-jacks. Analog matrix-encoded surround output, such as Dolby ProLogic, is a LNLVL_OUT signal (e.g., AUX_OUT signal 614) to consumer audio/video ("A/V") equipment that drives a home-theater multi-speaker array. Digital 5.1 channel output, such as Dolby Digital AC-3 is a SPDIF_OUT signal 616 that is transmitted via S/PDIF interface to digital ready consumer A/V equipment which drives a home-theater multi-speaker array.

Figure 7:
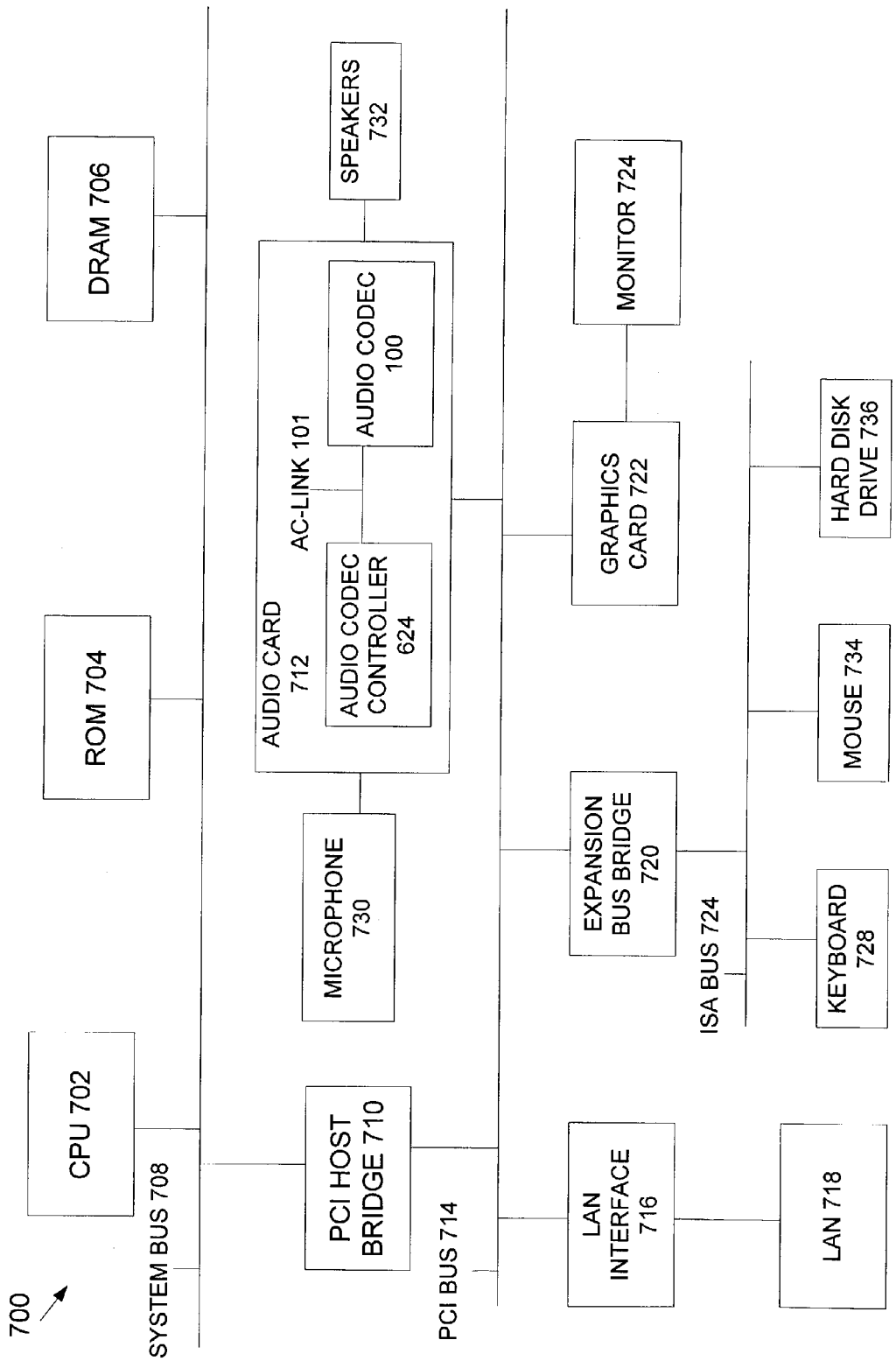
FIG. 7 is an exemplary block diagram of a computer system that has an audio card comprising and implementing the codec of FIG. 1 according to the present invention.

With reference now to FIG. 7, a typical computer system 700, which may be utilized in conjunction with a preferred embodiment of the present invention, is depicted. As shown, a central processing unit ("CPU") 702, a read only memory ("ROM") 704, a dynamic random access memory ("DRAM") 706 are connected to a system bus 708 of computer system 700. CPU 702, ROM 704, and DRAM 706 are also coupled to a PCI local bus 714 of computer system 700 through a PCI host bridge 710. PCI host bridge 710 provides a low latency path through which CPU 702 may directly access PCI devices mapped anywhere within bus memory and/or input/output ("I/O") address spaces. PCI host bridge 710 also provides a high bandwidth path allowing PCI devices to directly access DRAM 706.

In addition, an audio card 712 is attached to PCI local bus 714 for receiving audio input, such as from a microphone 730, and controlling audio output to speakers 732. Audio card 712 contains audio codec 100 with VOLS 190 and GAINS 192 according to the present invention, and audio codec 100 is coupled to audio codec controller 624 via AC-link 101. A graphics card 722 is attached to PCI local bus 714 for controlling visual output to a monitor 724. A local area network ("LAN") interface adapter 716 is coupled to PCI local bus 714. LAN interface adapter 716 is utilized for connecting computer system 700 to a LAN 718. A PCI-to-Industry Standard Architecture ("ISA") bus bridge, such as expansion bus bridge 720, may be utilized for coupling an ISA bus 724 to PCI local bus 714. A keyboard 728, a mouse 734, and a hard disk drive 736 are attached to ISA bus 724 for performing basic I/O functions. Although the illustrated exemplary embodiment describes a PCI local bus 714 and an ISA bus 724, the present invention is not limited to the particular bus architectures. Rather, the present invention can be utilized in any bus system having other bus architectures.

In summary, the present invention discloses a gain or input volume controller and method that includes a modified R2R ladder network having a number of R2R branches, switches coupled respectively to the R2R branches, and a switch controller for respectively controlling the switches to control and provide an overall gain value for a signal. The present gain or input volume controller and method are able to cancel offsets, reduce noise, and still consume a relatively low amount of die area. The present gain or input volume controller and method may also be identified with input impedance variation that has a smaller gain, with mixer output noise that is reasonably insensitive to gain settings smaller than 0 dB, and with a layout in which complete input signals, volume or gain control signals, and mixing signals use a single op amp that can be identified on de-capped integrated circuits (ICs).

The present invention provides the advantage of mixing and/or selecting one of multiple analog sources with independent gain control by VOLs 190 and GAIN 192, which each generally uses a modified R2R ladder network and an operational amplifier to accomplish such gain control. Resistor values and component values for the modified R2R ladder networks of VOLs 190 and GAIN 192 are seen equivalently through respective input and output ends. The values for these components of the op amp based gain control can be selected by a designer's criteria to provide a desired noise minimization aspect. The present invention also provides the feature and advantage of a log linear gain selection having a fine and coarse control with the modified R2R ladder network. Additionally, the present invention provides the further feature and advantage of mixing various analog sources in a single op amp stage and using a modified R2R ladder network in the feedback path of the op amp for gain variation. A further advantage and feature of the present invention is the minimization or elimination of glitches during gain changes of VOLs 190 or GAIN 192.

While the invention has been particularly shown and described with reference to a preferred embodiment, it will be understood by those skilled in the art that various changes in form and detail may be made therein without departing from the spirit and scope of the invention.

What is claimed is:

1. A gain controller, comprising:
    an input terminal for receiving a time-varying input signal;
    another input terminal for receiving a digital gain control signal;
    a modified R2R ladder network coupled to the input terminal for receiving the time-varying input signal and to the another input terminal for receiving the digital gain control signal;
    a mixer coupled to the modified R2R ladder network wherein the mixer produces an output signal, which is the time-varying input signal scaled by a gain factor, and the mixer performs a current-to-voltage conversion; and
    wherein the modified R2R ladder network further comprises:
    resistors for R2R branches of the modified R2R ladder network;
    switches coupled to the R2R branches; and
    a switch controller for controlling the switches in conformity with the digital gain control signal; and
    wherein the mixer further comprises:
    an operational amplifier having one input coupled to a common mode voltage and an output that provides the output signal; and
    a feedback resistor having one end coupled to another input of the operational amplifier and another end coupled to the output of the operational amplifier; and
    wherein an output of the modified R2R ladder network is a current fed into the feedback resistor and the another input of the operational amplifier.

2. The gain controller according to claim 1, wherein each of the R2R branches comprises:
    a resistor having a resistor value R wherein the resistor is one among a series of resistors in the modified R2R ladder network; and
    another resistor having a resistor value 2R, which is twice the resistor value R, wherein one end of the another resistor is coupled to an end of the resistor and another end of the another resistor is coupled to a common mode or an output path providing the output signal.

3. The gain controller according to claim 2, wherein:
    a respective one of the switches is coupled between another end of the another resistor and a common mode; and
    a respective another of the switches is coupled between the another end of the another resistor and the output path that provides the output signal.

4. The gain controller according to claim 1, wherein the switch controller further comprises:
    a mapper for mapping the digital gain control signal to the switches wherein the digital gain control signal respectively activates or deactivates the switches.

5. The gain controller according to claim 1, further comprising:
    a fine gain control stage for providing a fine gain control of the output signal; and
    a coarse gain control stage coupled to the fine gain control stage, wherein the coarse gain control stage includes the R2R ladder network and provides a coarse gain control of the output signal.

6. The gain controller according to claim 5, wherein the coarse gain control stage further comprises:
    the R2R ladder network having a number of R2R branches wherein each of the R2R branches has a resistor having a resistor value R wherein the resistor is one among a series of resistors in the modified R2R ladder network and another resistor having a resistor value 2R, which is twice the resistor value R, wherein one end, of the another resistor is coupled to an end of the resistor and another end of the another resistor is coupled to a common mode or an output path, and a respective one of the switches is coupled between the another end of the another resistor and a common mode and a respective another of the switches is coupled between the another end of the another resistor and an output path that provides the output signal;
    a first branch coupled at an input end of the R2R ladder network wherein the first branch includes a first additional resistor and a first additional switch coupled together in series and wherein one end of the first branch is coupled to an input end of an input path and another end of the first branch is coupled to the common mode; and
    a second branch coupled to an output end of the R2R ladder network wherein the second branch includes a second additional resistor and a second additional switch coupled together in series and wherein one end of the second branch is coupled to an output end of the output path and another end of the second branch is coupled to the common mode.

7. The gain controller according to claim 5, wherein the fine gain control stage further comprises:
    one resistor coupled to a series of resistors in the R2R ladder network;
    a selectable resistor path having resistors coupled together in series and additional switches wherein one end of the selectable resistor path is coupled to an end of the one resistor and another end of the selectable resistor path is coupled to a common mode and wherein a respective one of the additional switches is coupled between each node of the resistors in series and the common mode and wherein each of the respective one of the additional switches when activated provides a different resistance for the selectable resistor path.

8. The gain controller according to claim 5, further comprising:
    a resistor chain coupled to an input end of the fine gain control stage wherein the resistor chain further comprises:
    one resistor coupled to a series of resistors in the modified R2R ladder network; and
    a selectable resistor path having resistors coupled together in series and additional switches wherein one end of the selectable resistor path is coupled to an end of the one resistor and another end of the selectable resistor path is coupled to a common mode and wherein a respective one of the additional switches is coupled between each node of the resistors in series and the common mode and wherein each of the respective one of the switches when activated provides a different resistance for the selectable resistor path.

9. The gain controller according to claim 5, wherein one portion of the digital gain control signal controls the fine gain control stage and another portion of the digital gain control signal controls the coarse gain control stage.

10. The gain controller according to claim 1, wherein:
the output signal is an audio signal; and
the gain controller is a volume controller that Is able to couple to an input of an analog mixer and control a volume level during a playback operation of the audio signal.

11. The gain controller according to claim 1, wherein:
the output signal is an audio signal; and
the gain controller is able to couple in a feedback path of an operational amplifier and control a gain level during a capture operation of the audio signal.

12. A method for controlling gain of a signal by a gain controller, comprising:
inputting a time-varying input signal and a digital gain control signal into a modified R2R ladder network having resistors that provide R2R branches, switches coupled to the R2R branches, and a switch controller for controlling the switches in conformity with the digital gain control signal; and
producing an output signal by a mixer coupled to the modified R2R ladder network wherein the output signal is the time-varying input signal scaled by a gain factor and wherein the mixer performs a current-to-voltage conversion and wherein the mixer further comprises an operational amplifier having one input coupled to a common mode voltage and an output that provides the output signal, and a feedback resistor having one end coupled to another input of the operational amplifier and another end coupled to the output of the operational amplifier; and wherein an output of the modified R2R ladder network is a current fed into the feedback resistor and the another input of the operational amplifier.

13. The method according to claim 12, wherein inputting a time-varying Input signal and a digital gain control signal into a modified R2R ladder network further comprises:
providing for each of the R2R branches a resistor having a resistor value R, another resistor having a resistor value 2R, which is twice the resistor value R, a respective one of the switches coupled between the another resistor and a common mode, and a respective another of the switches coupled between the another resistor and an output path that provides the output signal; and
activating the respective one of the switches and the respective another of the switches to activate the respective each of the R2R branches.

14. The method according to claim 12, further comprising:
mapping the digital gain control signal to the switches wherein the digital gain control signal respectively activates or deactivates the switches.

15. The method according to claim 12, further comprising:
fine gain controlling the output signal; and
coarse gain controlling the output signal.

16. The method according to claim 15, wherein:
fine gain controlling further comprises utilizing one portion of the digital gain control signal; and
coarse gain controlling further comprises utilizing another portion of the digital gain control signal.

17. The method according to claim 12, wherein:
the output signal is an audio signal and the gain controller is a volume controller that is able to couple to an input of an analog mixer; and
producing an output signal further comprises controlling a volume level during a playback operation of the audio signal.

18. The method according to claim 12, wherein:
the output signal is an audio signal and the gain controller is able to couple in a feedback path of an operational amplifier; and
producing an output signal further comprises controlling a gain level during a capture operation of the audio signal.

19. A codec for coding and decoding signals, comprising:
a clock generator system for providing an operating clock signal for the codec;
a digital interface block having at least registers and a codec link interface for coupling to a codec controller wherein the clock generator system is coupled to the digital interface block;
a digital input/output interface block for digitally interfacing with input and output devices wherein the digital input/output interface block is coupled to the digital interface block;
an analog interface block having at least an analog-to-digital converter, an input multiplexer, an input mixer, an output mixer, a digital-to-analog converter wherein the analog interface block is coupled to the digital interface block, a volume controller coupled to an input of the digital-to-analog converter wherein the volume controller has an input terminal for receiving a time-varying input signal from the digital-to-analog converter, another input terminal for receiving a digital gain control signal, a modified R2R ladder network coupled to the input terminal for receiving the time-varying input signal and to the another input terminal for receiving the digital gain control signal wherein the modified R2R ladder network has resistors that provide R2R branches, switches coupled to the R2R branches, and a switch controller for controlling the switches in conformity with the digital gain control signal, and a mixer coupled to the modified R2R ladder network wherein the mixer produces an output signal, which is the time-varying input signal scaled by a gain factor and the mixer performs a current-to-voltage conversion and wherein the mixer further comprises an operational amplifier having one input coupled to a common mode voltage and an output that provides an output signal, and a feedback resistor having one end coupled to another input of the operational amplifier and another end coupled to the output of the operational amplifier; and wherein an output of the modified R2R ladder network is a current fed into the feedback resistor and the another input of the operational amplifier; and
a sample rate conversion system coupled between the digital interface block and the analog interface block to convert between respective sample rates of the digital interface block and the analog interface block.

20. The codec according to claim 19, further comprising:
a gain controller coupled to an input of the analog-to-digital converter wherein the gain controller has another modified R2R ladder network having a number of other R2R branches wherein other resistor values of the gain controller are selected, other switches coupled respectively to the other R2R branches, and another switch controller for respectively controlling the other switches to control and provide a gain value for a signal to be converted by the analog-to-digital converter.

21. The codec according to claim 20, wherein each of the other R2R branches has a resistor having a resistor value R wherein the resistor is one among a series of resistors in the modified R2R ladder network and another resistor having a resistor value 2R, which is twice the resistor value R, wherein one end of the another resistor is coupled to an end of the resistor and another end of the another resistor is coupled to a common mode and a respective one of the switches is coupled between the another end of the another resistor and a common mode and a respective another of the switches is coupled between the another end of the another resistor and an output path that provides the output signal.

22. The codec according to claim 19, wherein each of the R2R branches has a resistor having a resistor value R wherein the resistor is one among a series of resistors in the modified R2R ladder network and another resistor having a resistor value 2R, which is twice the resistor value R, wherein one end of the another resistor is coupled to an end of the resistor and another end of the another resistor is coupled to a common mode and a respective one of the switches is coupled between the another end of the another resistor and a common mode and a respective another of the switches is coupled between the another end of the another resistor and an output path that provides the output signal.

* * * * *